(12) United States Patent
Ford et al.

(10) Patent No.: US 8,471,414 B2
(45) Date of Patent: Jun. 25, 2013

(54) LOW IMPEDANCE POLARITY CONVERSION CIRCUIT

(75) Inventors: Timothy D. F. Ford, Beaconsfield (CA); Bernard Moffett, Pointe-aux-Trembles (CA)

(73) Assignee: The Flewelling Ford Family Trust, Beaconsfield (CA)

( * ) Notice: Subject to any disclaimer, the term of this patent is extended or adjusted under 35 U.S.C. 154(b) by 912 days.

(21) Appl. No.: 11/993,701

(22) PCT Filed: Jun. 23, 2006

(86) PCT No.: PCT/CA2006/001059
§ 371 (c)(1),
(2), (4) Date: Jun. 22, 2010

(87) PCT Pub. No.: WO2006/136034
PCT Pub. Date: Dec. 28, 2006

(65) Prior Publication Data
US 2010/0253144 A1    Oct. 7, 2010

Related U.S. Application Data

(60) Provisional application No. 60/693,447, filed on Jun. 24, 2005.

(51) Int. Cl.
*H02J 1/00*    (2006.01)
(52) U.S. Cl.
USPC .......................................................... 307/127
(58) Field of Classification Search
USPC .......................................................... 307/127
See application file for complete search history.

(56) References Cited

U.S. PATENT DOCUMENTS 3,626,201 A * 12/1971 Chambers, Jr. ................ 307/127
3,819,951 A *  6/1974 Moore ............................ 361/77
(Continued)

FOREIGN PATENT DOCUMENTS

| DE | 4019737 A1 | 1/1992 |
| EP | 0289625 | 9/1988 |

*Primary Examiner* — Adi Amrany
(74) *Attorney, Agent, or Firm* — Goudreau Gage Dubuc; Hugh Mansfield

(57) ABSTRACT

A low impedance polarity conversion circuit for driving a load with a DC power source is disclosed. The DC power source has a first pole from which a first DC signal originates and a second pole from which a second DC signal originates. The first DC signal has a voltage greater than a voltage of the second DC signal. The conversion circuit includes a circuit output node through which an output DC signal is delivered from the conversion circuit to the load. The conversion circuit also includes a charge conditioning circuit for generating third and fourth DC signals. The third DC signal has a voltage greater than the first DC signal voltage and the fourth DC signal has a voltage less than the second DC signal voltage. A rectification circuit includes first and second inputs for attachment to the first pole and the second pole. A Field-Effect Transistor (FET) bridge is electrically connected to the first and second inputs. The FET bridge includes first and second pairs of cooperating FETs. The third voltage controls a first of the first pair of FETs and a first of the second pair of FETs. The fourth voltage controls a second of the first pair of FETs and a second of the second pair of FETs. The FET bridge is for rectifying the first and second DC signals in order that the output DC signal is the same polarity irrespective of whether the first input is attached to the first pole or the second pole.

11 Claims, 6 Drawing Sheets

U.S. PATENT DOCUMENTS

| | | | |
|---|---|---|---|
| 4,139,880 A * | 2/1979 | Ulmer et al. | 361/246 |
| 4,319,144 A | 3/1982 | King et al. | |
| 4,420,786 A * | 12/1983 | Toney | 361/77 |
| 4,423,456 A * | 12/1983 | Zaidenweber | 361/77 |
| 4,473,757 A | 9/1984 | Farago et al. | |
| 4,517,555 A | 5/1985 | Marsocci et al. | |
| 4,906,858 A | 3/1990 | Gesin | |
| 4,947,126 A | 8/1990 | May et al. | |
| 4,989,114 A | 1/1991 | Storti et al. | |
| 5,623,550 A | 4/1997 | Killion | |
| 5,757,223 A * | 5/1998 | Nevin | 327/536 |
| 5,842,777 A | 12/1998 | McDermott | |
| 6,002,212 A | 12/1999 | Gagnot | |
| 6,130,488 A | 10/2000 | Hansen et al. | |
| 6,445,132 B1 | 9/2002 | Ford | |
| 6,462,929 B2 * | 10/2002 | Compton et al. | 361/246 |
| 6,670,874 B1 | 12/2003 | Galli | |
| 6,765,774 B2 | 7/2004 | Telefus et al. | |
| 6,825,577 B2 | 11/2004 | Soto et al. | |
| 7,411,768 B2 * | 8/2008 | Sells | 361/77 |
| 7,561,404 B2 * | 7/2009 | Sells | 361/246 |
| 7,759,908 B2 * | 7/2010 | LeMay et al. | 320/166 |
| 2005/0127859 A1 | 6/2005 | Kernhof et al. | |
| 2009/0315598 A1 * | 12/2009 | Namekawa | 327/157 |

\* cited by examiner

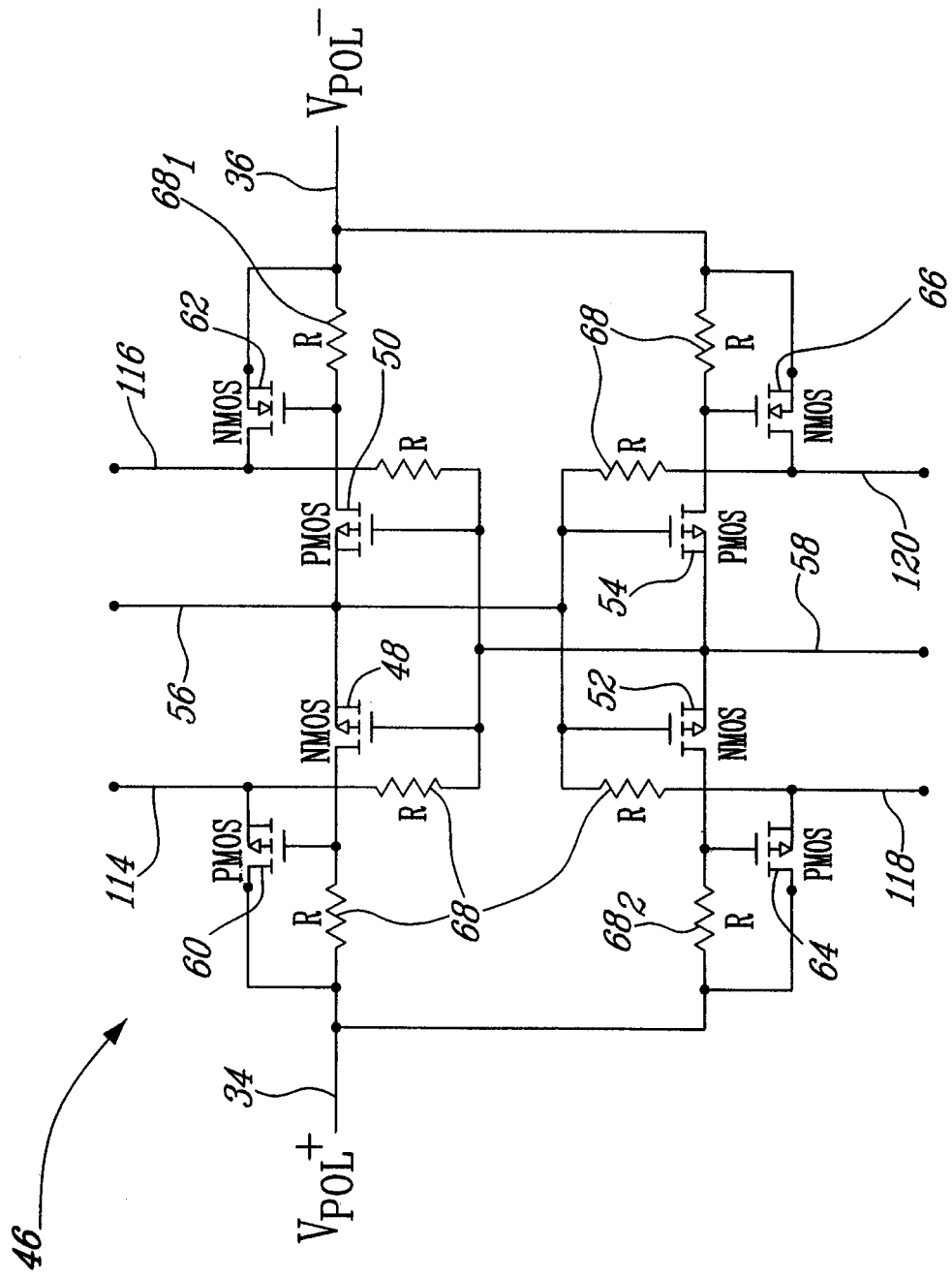

LOW IMPEDANCE POLARITY CONVERSION CIRCUIT

CROSS-REFERENCE TO RELATED APPLICATIONS

This application is a National Entry Application of PCT application No. PCT/CA2006/001059 filed on Jun. 23, 2006 and published in English under PCT Article 21(2), which itself claims priority on U.S. provisional application No. 60/693,447, filed on Jun. 24, 2005. All documents above are incorporated herein in their entirety by reference.

FIELD

The disclosure relates to conversion circuits and, in particular to power source polarity converters.

BACKGROUND

A four-diode rectifier bridge is commonly used in converting an AC input voltage to a DC output voltage. This type of bridge can also be used in translating a DC input of arbitrary polarity into a DC output of known polarity; however a consequence of using the four-diode rectifier bridge is a forward voltage drop of two diodes when current is flowing. This consequence means less than ideal efficiency in power supply applications.

Accordingly, it would be advantageous to improve DC power source polarity converters.

SUMMARY

According to one example embodiment, there is a low impedance polarity conversion circuit for driving a load with a DC power source having a first pole from which a first DC signal originates and a second pole from which a second DC signal originates. The first DC signal has a voltage greater than a voltage of the second DC signal. The conversion circuit includes a circuit output node through which an output DC signal is delivered from the conversion circuit to the load. The conversion circuit also includes a charge conditioning circuit for generating third and fourth DC signals. The third DC signal has a voltage greater than the first DC signal voltage and the fourth DC signal has a voltage less than the second DC signal voltage. A rectification circuit includes first and second inputs for attachment to the first pole and the second pole. A Field-Effect Transistor (FET) bridge is electrically connected to the first and second inputs. The FET bridge includes first and second pairs of cooperating FETs. The third voltage controls a first of the first pair of FETs and a first of the second pair of FETs. The fourth voltage controls a second of the first pair of FETs and a second of the second pair of FETs. The FET bridge is for rectifying the first and second DC signals in order that the output DC signal is the same polarity irrespective of whether the first input is attached to the first pole or the second pole.

According to another example embodiment, there is a circuit protector for attachment via first and second inputs to first and second poles of a DC power source. A first DC signal originates from the first pole and a second DC signal originates from the second pole. The first DC signal has a voltage greater than a voltage of the second DC signal. The circuit protector includes an output node through which an output DC signal is delivered to a load. A rectification circuit includes a Field-Effect Transistor (FET) bridge electrically connectable to the first and second inputs. The FET bridge includes first and second pairs of cooperating FETs. A control circuit selectively activates the first pair of FETs and the second pair of FETs such that the output DC signal is the same polarity irrespective of whether the first input is attached to the first pole or the second pole.

According to another example embodiment, there is a method for lowering impedance of a Field-Effect Transistor (FET) bridge having first and second pairs of cooperating FETs. The method includes the step of receiving a pair of DC input signals which enable activation of one of the cooperating pairs of FETs. The activation provides a path for the DC input signals through the two activated FETs. The pair of DC input signals have voltages differing from each other by a first amount. The method also includes the step of applying a second pair of DC signals each to a different gate of the two activated FETs. The second pair of DC signals have voltages differing from each other by a second amount that is greater than the first amount. As a result of the second amount being greater than the first amount, impedances of the two activated FETs are lower as compared to if the pair of DC input signals were instead used in substitution for the second pair of DC signals.

In one aspect of the above-mentioned example embodiment, the second pair of DC signals are boosted voltage signals.

According to yet another example embodiment, there is a circuit for lowering impedance of a Field-Effect Transistor (FET) bridge having first and second pairs of cooperating FETs. The FET bridge receives a pair of DC input signals which enable activation of one of the cooperating pairs of FETs. The activation provides a path for the DC input signals through the two activated FETs. The pair of DC input signals have voltages differing from each other by a first amount. The circuit includes means for generating a second pair of DC signals having voltages differing from each other by a second amount that is greater than the first amount. The circuit also includes means for applying the second pair of DC signals each to a different gate of the two activated FETs. As a result of the second amount being greater than the first amount, impedances of the two activated FETs are lower as compared to if the pair of DC input signals were instead used in substitution for the second pair of DC signals.

According to yet another example embodiment, there is a circuit protector for interposition between first and second poles of a DC power source on an input side of the circuit protector, and first and second inputs of a circuit on an output side of the circuit protector. The first pole of the DC power source has a first DC signal originating from it. The second pole of the DC power source has a second DC signal originating from it. The circuit protector includes first and second circuit protector inputs for attachment to the first and second poles of the DC power source, and first and second outputs for attachment to the first and second inputs of the circuit. A Field-Effect Transistor (FET) bridge is electrically connected to the first and second circuit protector inputs. The FET bridge includes first and second pairs of cooperating FETs for rectifying the first and second DC signals in order that polarity of a voltage between the first and second outputs is the same regardless of polarity of the DC power source across the first and second circuit protector inputs. If the first pair of FETs are activated, the second pair of FETs are non-activated, but if the second pair of FETs are activated, the first pair of FETs are non-activated. A control circuit is electrically connected to each gate the FETs of the first and second pairs of FETs. The control circuit is for making a pair of DC signals available at gates of only whichever of the pairs of FETs is the activated pair.

BRIEF DESCRIPTION OF THE DRAWINGS

Reference will now be made, by way of example, to the accompanying drawings:

FIG. 2B is a schematic diagram of a control circuit in accordance with an example embodiment;

DETAILED DESCRIPTION OF EXAMPLE EMBODIMENTS

Figure 1:
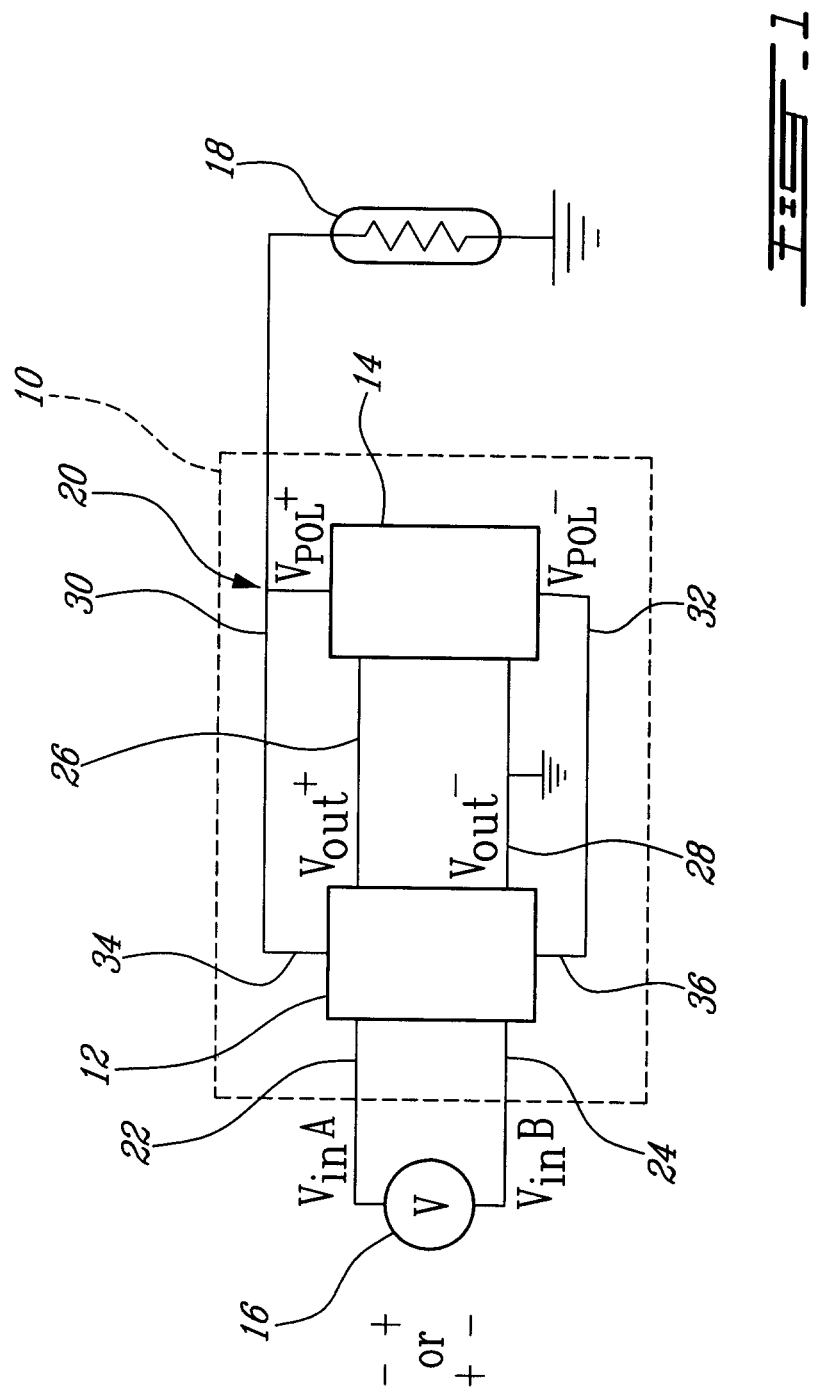
FIG. 1 is a block diagram of a power source polarity converter, a power source and a load in accordance with at least some example embodiments.

Referring now to FIG. 1, a power source polarity converter in accordance with at least some example embodiments will be described. The converter, generally referred to using the reference numeral 10, comprises a rectification circuit 12 interconnected with a charge conditioning circuit 14. A DC power source 16 having positive and negative poles provides DC power to the converter 10 which is conditioned by the rectification circuit 12 and the charge conditioning circuit 14 to provide a DC output for driving a load 18. In the illustrated configuration, the load 18 is connected between a circuit output node 20 of the converter 10 and the circuit ground. It will be understood that the load 18 receives the DC output delivered by the converter 10 by way of the node 20.

Still referring to FIG. 1, the rectification circuit 12 conditions DC power provided by the DC power source 16 between the converter inputs 22, 24 such that the polarity of the voltage which appears between the inversion circuit outputs 26, 28 has the same polarity, regardless of the polarity of the DC power source 16 between the converter inputs 22, 24. The voltage which appears between the inversion circuit outputs 26, 28 (illustratively labelled Vout+ and Vout−) are in turn input into the charge conditioning circuit 14. The charge conditioning circuit 14 provides an output voltage across the charge conditioning circuit outputs 30, 32, illustratively labelled Vpol+ and Vpol−. Examples of conditioning circuits as in 14 include DC-to-DC converters such as charge pumps, buck and boost converters, etc. Additionally, the voltage between the charge conditioning circuit outputs 30, 32 is fed back to the rectification circuit 12 via the polarity inversion circuit conditioning inputs 34, 36.

Figure 2A:
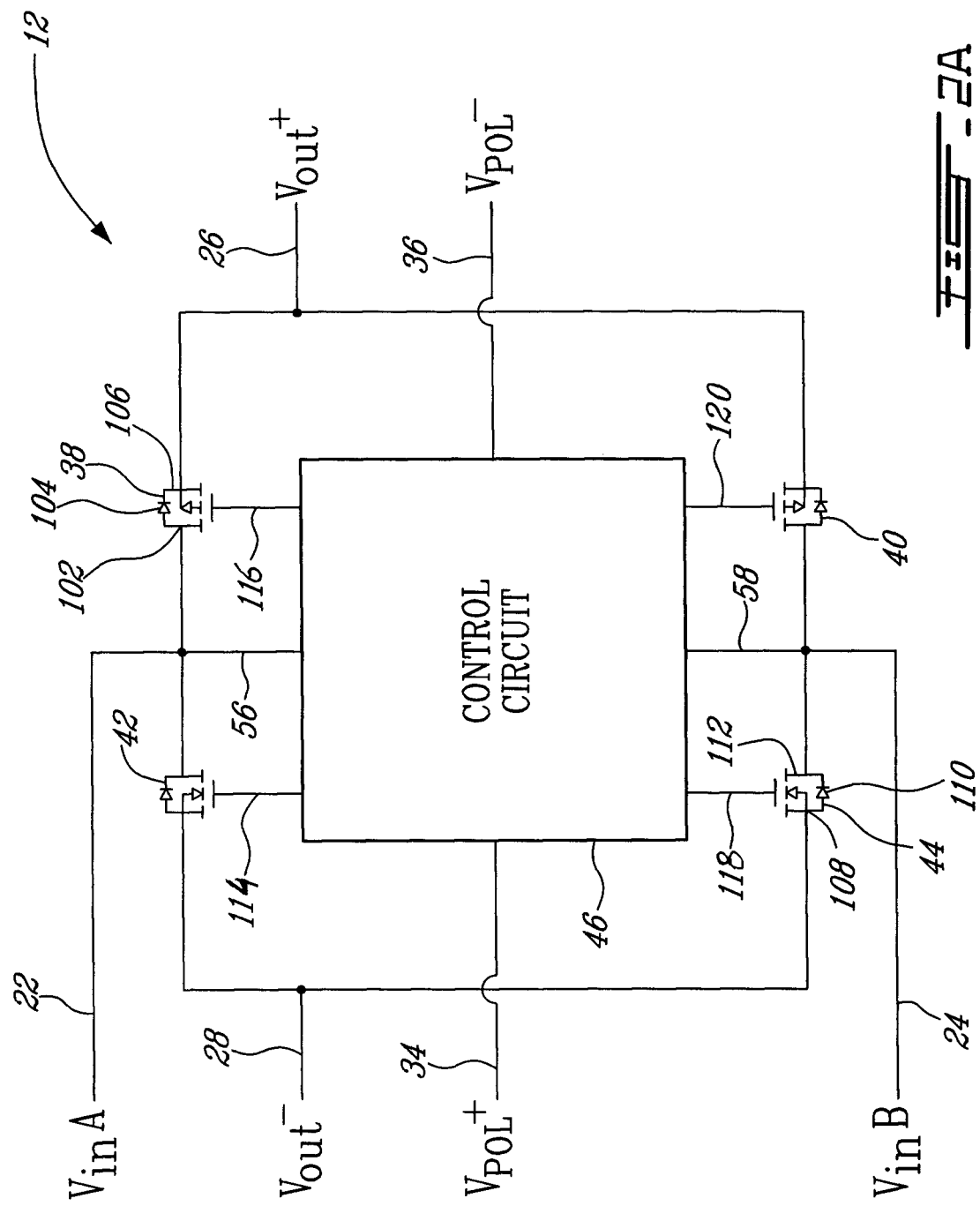
FIG. 2A is a schematic diagram of a rectification circuit in accordance with an example embodiment.

Referring now to FIG. 2A, the rectification circuit 12 comprises a pair of P-Channel MOSFETs as in 38, 40 and a pair of N-Channel MOSFETs as in 42, 44. The illustrated circuit also includes a control circuit 46 which illustratively receives Vpol+ and Vpol− on the polarity inversion circuit conditioning inputs 34, 36; however one skilled in the art will appreciate that in some alternative examples DC voltage signals similar to Vpol+ and Vpol− might be generated within the control circuit 46 by a self-contained DC source (for example, a battery and, as necessary, complementary control circuit, both not shown, for generating the requisite signals). In operation, the control circuit 46 selectively activates either the FETs 40 and 42 or the FETs 38 and 44 as later explained in this disclosure.

Referring to FIG. 2B in addition to FIG. 2A, in some examples, the control circuit 46 will include the components illustrated in FIG. 2B. Four (4) level sensing transistors 48, 50, 52 and 54 are electrically connected to the converter inputs 22, 24 for "sensing" voltage of the DC signals found on those inputs. In particular, the transistor 48 is connected to the input 22 via conductor 56, the transistor 50 is connected to the input 22 via conductor 56, the transistor 52 is connected to the input 24 via conductor 58, and the transistor 54 is connected to the input 24 via the conductor 58. Also, the gates of the illustrated transistors 48 and 50 are connected to the input 24 via the conductor 58, and the gates of the illustrated transistors 52 and 54 are connected to the input 22 via the conductor 56. In at least one example, the level sensing transistors 48, 50, 52 and 54 are PMOS transistors.

The illustrated control circuit 46 also includes four (4) switching transistors 60, 62, 64 and 66 (in at least one example, the switching transistors 60, 62, 64 and 66 are NMOS transistors). The illustrated control circuit 46 also includes eight (8) resistive elements R 68. In at least one example, the resistive elements as in 60 each have the same nominal value such as 1MΩ, for instance. The power MOSFETs 38, 40, 42 and 44, level sensing transistors 48, 50, 52 and 54 switching transistors 60, 62, 64 and 66, and resistive elements as in 68 are interconnected by conductors such as, for example conductive traces on a PC Board (PCB) or the like, on which the various elements have been mounted.

Figure 3:
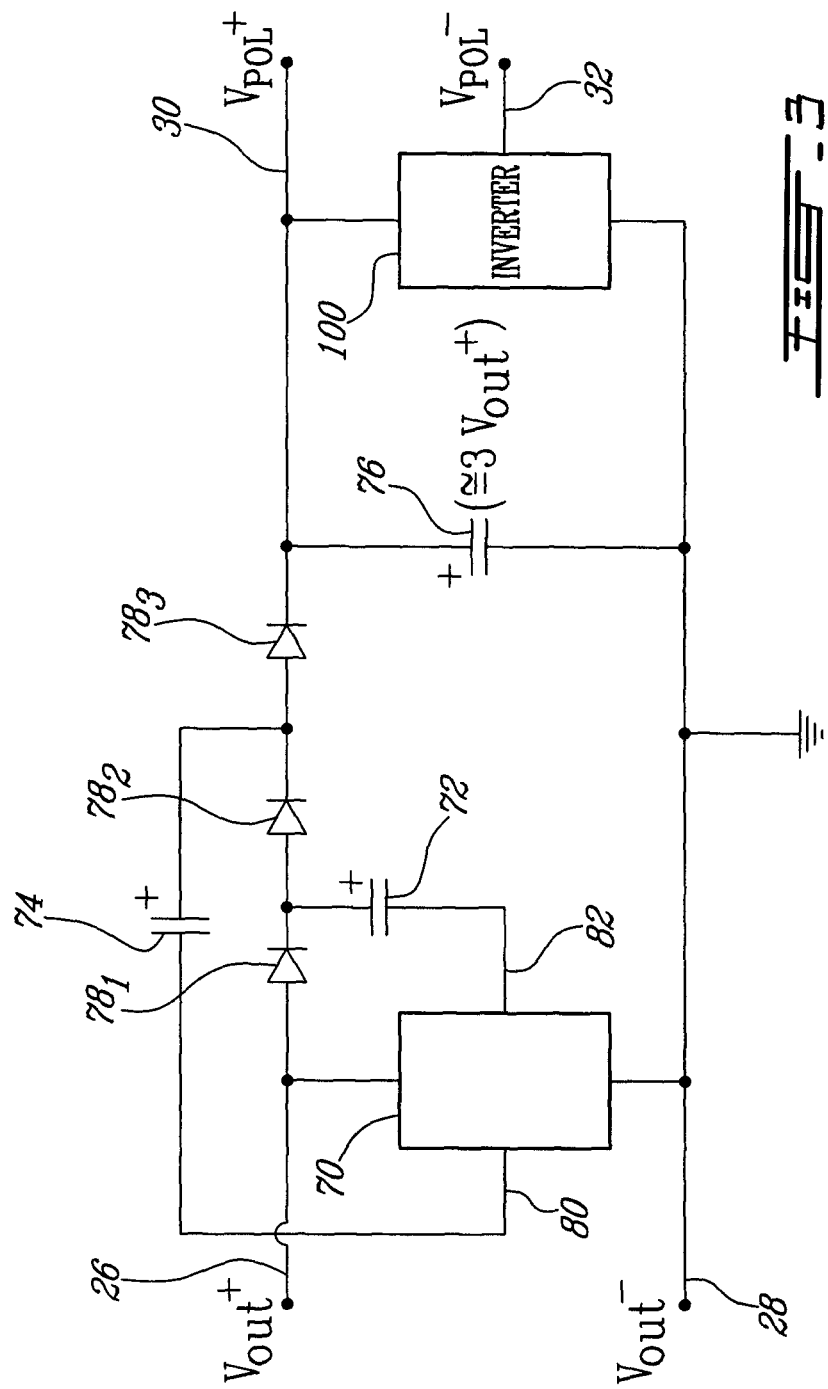
FIG. 3 is a schematic diagram of a charge conditioning circuit in accordance with at least one example embodiment.

Referring now to FIG. 3, the illustrated charge conditioning circuit 14 comprises a switch circuit 70 (alternatively referred to in this disclosure as charge directing circuitry) which supplies a switched voltage to first and second charge transfer capacitors 72, 74 and a storage capacitor 76 interconnected by diodes as in $78_1$, $78_2$ and $78_3$. Beginning with a more general explanation of function, a number of capacitors are, in accordance with at least some examples of the charge conditioning circuit 14, in communication with charge directing circuitry (such as, for example, a monostable multivibrator). In configuration for voltage boosting, these capacitors have their charging regulated by the charge directing circuitry. As understood by those skilled in the art, the implementation details for this voltage boosting by way of a suitable capacitor arrangement will vary; however it is instructive to mention some implementation details of the illustrated example embodiment.

With respect to the circuit illustrated in FIG. 3, this example circuit provides for a trebling of the input voltage and as a result a voltage between the charge conditioning circuit outputs 30, 32 will be approximately three times the voltage between the inversion circuit outputs 26, 28. As will be appreciated by persons of ordinary skill in the art, charge conditioning circuits which double, quadruple or provide other multiples of the voltage input to the inversion circuit outputs 26, 28 at the conditioning circuit outputs 30, 32 may also be provided for.

Figure 4:
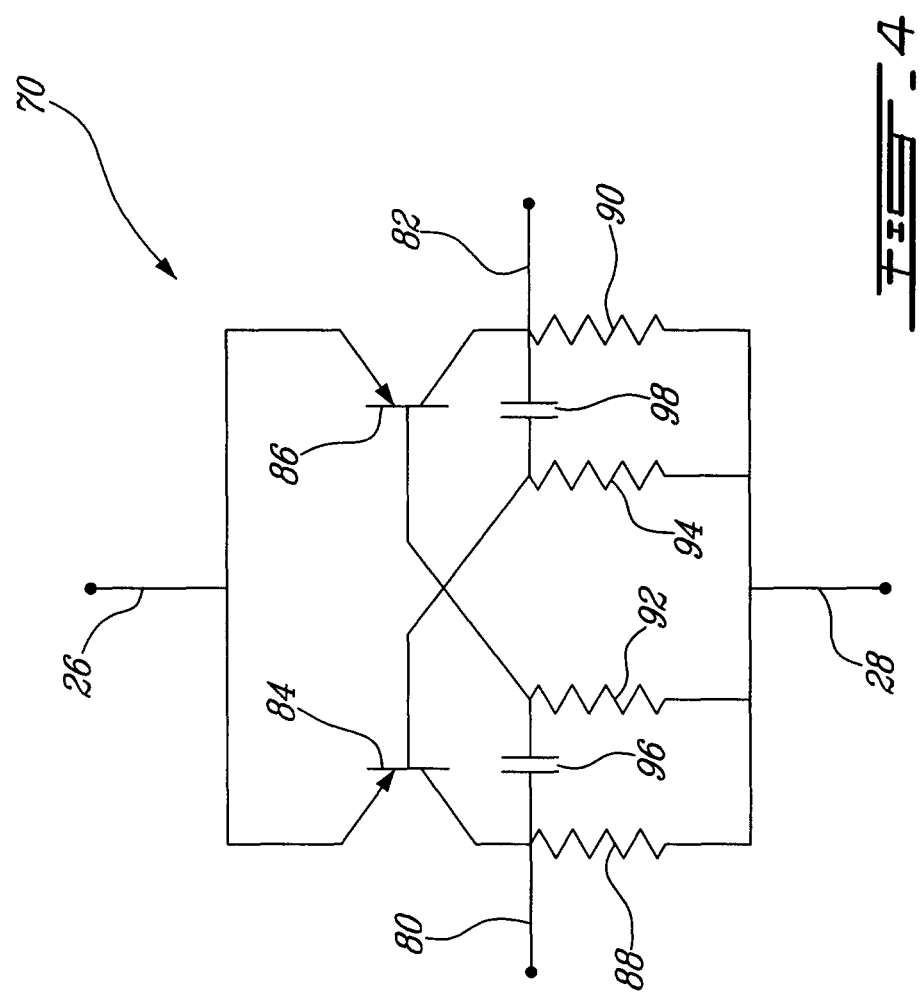
FIG. 4 is a schematic diagram of a monostable multivibrator in accordance with an example embodiment.

Referring now to FIG. 4 in addition to FIG. 3, the illustrated switch circuit 70 is comprised of first and second PNP type transistors 84, 86, first and second collector resistors 88, 90, first and second biasing resistors 92, 94 and first and second capacitors 96, 98. The elements 84 through 98 of the switch circuit 70 form a monostable multivibrator. As known in the art, the transistors within the monostable multivibrator circuit alternate between conducting and non-conducting states, wherein one transistor is in a conducting state while the other is in the non-conducting state. When the first transistor 84 is conducting, second transistor 86 is not conducting and the first diode $78_1$ is forward biased. As a result the first charge transfer capacitor 72 is charged to the same voltage as that which is found between the inversion circuit outputs 26, 28. When the second transistor 86 is forward biased and conducting, first transistor 84 is reversed biased (and therefore not conducting). At the same time, the first diode 78₁ is reversed biased and the second diode 78₂ is forward biased. As result the second charge transfer capacitor is charged to the same voltage as that which is found between the inversion circuit outputs 26, 28 plus the voltage across the first charge transfer capacitor 72. When the first transistor 84 is once again forward biased and the second transistor 86 reversed biased, the second diode 78₂ is reversed biased and the third diode 78₃ forward biased. As a result, the storage capacitor 76 is charged to the voltage found between the inversion circuit outputs 26, 28 plus the voltage across the second charge transfer capacitor 72, which gives rise to a boosted voltage across the positive and negative charge conditioning circuit outputs 30, 32.

Still with reference to FIG. 3, in order to invert the output voltage to provide a negative output of equal magnitude, there is provided an inverter circuit 100 which inverts the positive output found on the positive conditioning circuit output 30, this negative voltage being available on the negative conditioning circuit output 32. Thus in the illustrated embodiment, generation of the DC signal on the circuit output 32 is carried out by inverting the DC signal on the circuit output 30 (after this latter signal has itself been generated of course).

Alternatively, such voltage multiplying circuits, multivibrators, or portions thereof are also available as integrated circuits.

Referring back to FIGS. 2A and 2B, in steady state operation, provision of a positive or negative voltage between the converter inputs 22, 24 causes a positive voltage to appear between the inversion circuit outputs 26, 28. This output voltage is boosted by the charge conditioning circuit 14 (FIG. 1) such that the voltage between the charge conditioning circuit outputs 30, 32 is greater than the voltage between the converter inputs 22, 24.

The MOSFETs 38, 40, 42 and 44 are the principle transistors, and act both as diodes and switches between the converter inputs 22, 24 and the inversion circuit outputs 26, 28. When they are activated, the MOSFETs 38, 40, 42 and 44 are in saturation and therefore acting as variable resistances. Conversely (as will be appreciated by one skilled in the art) when they are non-activated, any of the MOSFETs 38, 40, 42 and 44 will present such high resistance as to essentially behave like an open circuit.

Each of the MOSFETs 38, 40, 42 and 44 includes a diode body between source and drain. A positive DC voltage applied between the converter inputs 22, 24 causes a current to flow through the MOSFET 38 from the source 102 via the diode 104 to the drain 106. Similarly, the current flows through the transistor 44 from the source 108 via the diode 110 to the drain 112. (In the context of the illustrated rectification circuit 12, a positive DC voltage applied between the converter inputs 22, 24 enables activation of the FETs 38 and 44, whereas a negative DC voltage applied between the converter inputs 22, 24 does not enable activation.)

With current flowing through the FETs 38 and 44, a similar voltage to the initial voltage appears between the inversion circuit outputs 26, 28 which is boosted by the charge conditioning circuit 14 (FIG. 1). The boosted voltage is provided back to the polarity conversion circuit via the polarity inversion circuit conditioning inputs 34, 36.

The illustrated rectification circuit 12 includes the control circuit 46 that is electrically connected via conductors 114, 116, 118 and 120 to the gates of the FETs 42, 38, 44 and 40 respectively. As will be explained in more detail below, in the illustrative embodiment disclosed in the figures, the control circuit 46 operates to make the boosted voltage signals on the polarity inversion circuit conditioning inputs 34, 36 available to those of the FETs 38, 40, 42 and 44 that happen to be the activated pair.

Within the control circuit 46, the level sensing transistors 48, 50, 52 and 54 each selectively enable a respective one of the switching transistors 60, 62, 64 and 66 depending on polarity of the power source applied between the converter inputs 22, 24. This in turn allows boosted voltage signals provided via the polarity inversion circuit conditioning inputs 34, 36 to be selectively applied to the gates of the MOSFETs 38, 40, 42 and 44.

For example, assuming that the DC power source applied between the converter inputs 22, 24 has a positive polarisation and the charge conditioning circuit 14 provides for a voltage between the polarity inversion circuit conditioning inputs 34, 36 which is three (3) times the voltage between the inversion circuit outputs 26, 28, a voltage will be provided on polarity inversion circuit conditioning input 36. A potential difference equal to the voltage at the converter inputs 22, 24 will appear between the source and gate of the level sensing transistor 50, thereby turning the level sensing transistor 50 on and causing a voltage drop across the resistive element 68₁. This in turn causes a voltage drop between gate and drain of the switching transistor 62 thereby causing the voltage provided on polarity inversion circuit conditioning input 36 to be available at the gate of the MOSFET 38, thereby increasing the potential difference between gate and source of the MOSFET 38.

With an increase in potential difference between source and gate of the MOSFET 38, the resistance in the drain of the MOSFET 38 drops, causing a similar drop in the potential difference between source and drain for the same current. Similarly, a potential difference equal to the voltage at the converter inputs 22, 24 will appear between the gate and source of the level sensing transistor 52, thereby turning the level sensing transistor 52 on and causing a voltage drop across the resistive element 68₂. This in turn cases a voltage drop between drain and gate of the switching transistor 64 causing the voltage provided on polarity inversion circuit conditioning input 34 to be available at the gate of the MOSFET 44, thereby increasing the potential difference between gate and source of the MOSFET 44.

With an increase in potential difference between gate and source of the MOSFET 44, the resistance in the drain of the MOSFET 44 drops, causing a similar drop in the potential difference between source and drain for the same current. With the positive and negative poles of the power source 16 attached to the converter inputs 22, 24 so that the power source 16 is oriented for circuit behaviour as described above, only the cooperating pair of MOSFETs 38 and 44 are enabled (i.e. activated). In other words, the cooperating pair of MOSFETs 42 and 40 are non-activated when the other pair of FETs in the bridge are activated.

Given the symmetry of the circuit, as will now be apparent to a person of ordinary skill in the art, when the DC power source 16 placed between the converter inputs 22, 24 is inverted (e.g. the attachment of the converter inputs 22 and 24 to the positive and negative poles of the power source 16 is switched around) the cooperating pair of MOSFETs 42 and 40 will be enabled (i.e. activated) and the cooperating pair of MOSFETs 38 and 44 disabled (i.e. non-activated) thereby inverting the input.

Referring to FIG. 1, in a particular embodiment, and with appropriate selection of the components used for its manufacture, alternatively the rectification circuit 12 can be used alone without the charge conditioning circuit 14 as a minimal impedance universal circuit protector for protecting electronic circuits or other loads from what would otherwise be an accidental reversal of the DC power source 16.

Figure 5:
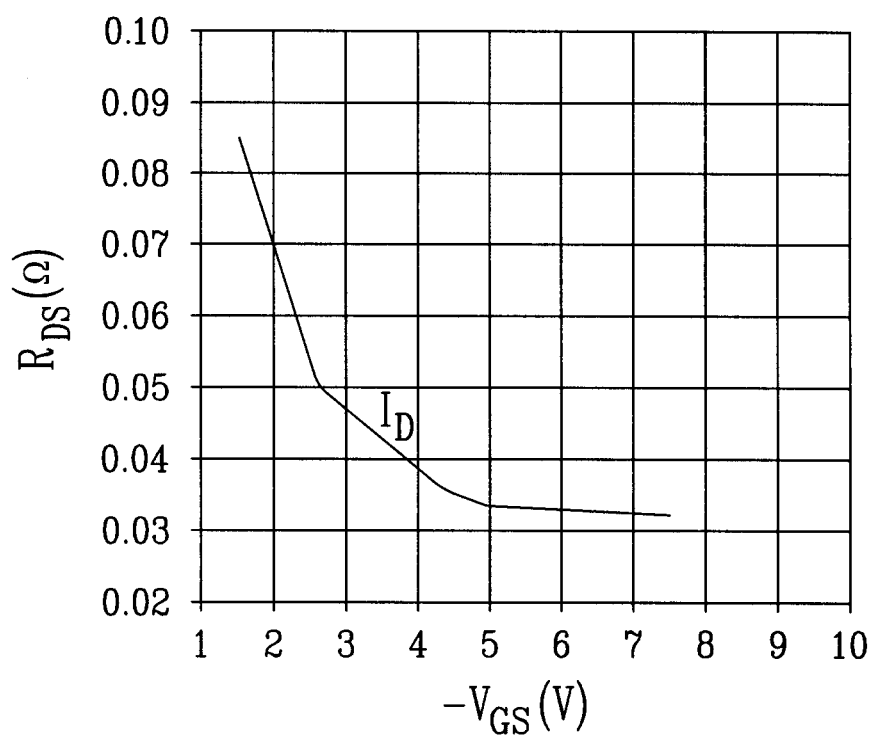
FIG. 5 is a graph of the relationship between $R_{DS}$ and $-V_{GS}$ in a typical P-channel MOSFET.

Referring to FIG. 5, the resistance $R_{DS}$ between drain and source in a typical P-channel MOSFET varies with the voltage $V_{GS}$ applied between gate and source. As will be evident from the graph to a person of skill in the art, as the voltage difference between the gate and source ($V_{GS}$) becomes a larger negative value, the MOSFET moves into a region of low impedance operation giving rise to a corresponding decrease in the resistance $R_{DS}$. It follows that provided the gate-to-source voltage difference is sufficiently large, the voltage $V_{DS}$ across drain and source, and therefore loss of power which would otherwise be experienced in the circuit, can be reduced to negligible amounts. A similar phenomenon arises in an N-channel MOSFET. Putting the above described relationship in the context of an example applicable to this disclosure rather than applying the DC signals from the power source 16 each to a different gate of the appropriate FET, the boosted voltage signals generated by the charge circuit 14 are instead applied so that (as graphically shown in FIG. 5) $-V_{GS}$ increases and $R_{DS}$ decreases, reducing the impedances of the activated FETs is possible.

Referring now to FIGS. 1 and 2, provided the DC power source 16 is able to provide a sufficient voltage difference between converter inputs 22, 24, complete saturation of the Source-Gate junction of (depending on polarity of the DC power source 16) the MOSFETs 38, 44 or 40, 42 may be obtained and the MOSFETs 38, 44 or 40, 42 will be placed in a low impedance operation mode. The positive inversion circuit output 26 is fed back to the positive polarity inversion circuit conditioning input 34 (i.e. Vout+ is fed back to Vpol+) which assists in maintaining the low impedance saturation mode without a need for a boosted voltage. Similarly, the negative inversion circuit output 28 is fed back to the negative polarity inversion circuit conditioning input 36 (i.e. Vout− is fed back to Vpol−). As a result, and given the low internal impedance of the saturated MOSFETs, the potential difference between the inversion circuit outputs 26, 28 is virtually identical to the potential difference between converter inputs 22, 24, regardless of the polarity of the DC power source 16 polarity connection for as long as DC power source 16.

It is to be understood that the invention is not limited in its application to the details of construction and parts illustrated in the accompanying drawings and described hereinabove. Example embodiments are capable of being practised in various ways. It is also to be understood that the phraseology or terminology used herein is for the purpose of description and not limitation. It will further be understood that example embodiments described hereinabove can be modified, without departing from the spirit, scope and nature of the subject invention as defined in the appended claims.

What is claimed is:

1. A low impedance polarity conversion circuit for driving a load with a DC power source having a first pole from which a first DC signal originates and a second pole from which a second DC signal originates, the first DC signal having a voltage greater than a voltage of the second DC signal, the conversion circuit comprising:
    a circuit output node through which an output DC signal is delivered from the conversion circuit to the load;
    a charge conditioning circuit for generating third and fourth DC signals, said third DC signal having a voltage greater than the first DC signal voltage and said fourth DC signal having a voltage less than the second DC signal voltage;
    a rectification circuit including:
        first and second inputs for attachment to the first pole and the second pole; and
        a transistor bridge electrically connected to said first and second inputs, said bridge including first and second pairs of cooperating transistors, said third voltage controlling a first of said first pair of transistors and a first of said second pair of transistors, and said fourth voltage controlling a second of said first pair of transistors and a second of said second pair of transistors, said bridge for rectifying the first and second DC signals in order that said output DC signal is the same polarity irrespective of whether said first input is attached to the first pole or the second pole.

2. The conversion circuit as claimed in claim 1, wherein said transistor bridge is a Field Effect Transistor (FET) bridge and said transistors are FETs.

3. The conversion circuit as claimed in claim 1, wherein said first pair of transistors are activated when said first and second inputs are attached to the first and second poles respectively, and said second pair of transistors are activated when said first and second inputs are attached to the second and first poles respectively.

4. The conversion circuit as claimed in claim 3, wherein when said first pair of transistors are activated said second pair of transistors are non-activated, and when said second pair of transistors are activated said first pair of transistors are non-activated.

5. The conversion circuit as claimed in claim 4, wherein said rectification circuit further includes a control circuit electrically connected to gates of each of said first and second pairs of transistors, said control circuit for making said generated third and fourth DC signals available to the activated pair of said pairs of transistors.

6. The conversion circuit as claimed in claim 5, wherein said control circuit includes four level sensing transistors and four switching transistors.

7. The conversion circuit as claimed in claim 6, wherein said level sensing transistors are P-channel transistors and said switching transistors are N-channel transistors.

8. The conversion circuit as claimed in claim 1, wherein a voltage difference amount between said generated third and fourth DC signals is between two and four times a voltage difference amount between said first and second DC signals.

9. The conversion circuit as claimed in claim 1, wherein said charge conditioning circuit includes a monostable multivibrator and a number of capacitors configured for voltage boosting and in communication with said monostable multivibrator, said monostable multivibrator for regulating charging of said capacitors.

10. The conversion circuit as claimed in claim 1, wherein said generated third and fourth DC signals are substantially of equal and opposite magnitude.

11. The conversion circuit as claimed in claim 10, wherein said charge conditioning circuit includes an inverter, said inverter including an input and an output, and when said third DC signal is received at said inverter input said fourth DC signal is outputted at said inverter output.

* * * * *